(12) United States Patent
Oldenkamp

(10) Patent No.: US 12,237,807 B2
(45) Date of Patent: Feb. 25, 2025

(54) FRAME FOR PHOTOVOLTAIC MODULES

(71) Applicant: Solarnative GmbH, Frankfurt (DE)

(72) Inventor: Hendrik Oldenkamp, The Hague (NL)

(73) Assignee: Solarnative GmbH, Frankfurt (DE)

( * ) Notice: Subject to any disclaimer, the term of this patent is extended or adjusted under 35 U.S.C. 154(b) by 0 days.

(21) Appl. No.: 17/785,924

(22) PCT Filed: Oct. 17, 2020

(86) PCT No.: PCT/DE2020/000251
§ 371 (c)(1),
(2) Date: Jun. 16, 2022

(87) PCT Pub. No.: WO2021/141449
PCT Pub. Date: Jun. 24, 2021

(65) Prior Publication Data
US 2023/0017338 A1    Jan. 19, 2023

(30) Foreign Application Priority Data
Dec. 19, 2019   (DE) .................. 10 2019 008 853.0

(51) Int. Cl.
H02S 40/34     (2014.01)
H01L 31/02     (2006.01)
H02S 30/10     (2014.01)

(52) U.S. Cl.
CPC ........ *H02S 40/34* (2014.12); *H01L 31/02008* (2013.01); *H02S 30/10* (2014.12)

(58) Field of Classification Search
CPC ..... F24S 2025/801; H02S 40/32; H02S 30/10
See application file for complete search history.

(56) References Cited

U.S. PATENT DOCUMENTS

| | | | | |
|---|---|---|---|---|
| 6,111,189 A | * | 8/2000 | Garvison | H01L 31/078 126/621 |
| 2010/0275976 A1 | * | 11/2010 | Rubin | H01L 31/0512 136/251 |
| 2014/0182662 A1 | * | 7/2014 | West | H02S 30/10 248/617 |
| 2016/0181939 A1 | * | 6/2016 | dos Santos | H02S 40/32 136/251 |
| 2017/0366136 A1 | * | 12/2017 | Feldmann | H01R 24/30 |
| 2019/0393833 A1 | | 12/2019 | Oldenkamp | |

FOREIGN PATENT DOCUMENTS

| | | |
|---|---|---|
| EP | 0977274 | 2/2000 |
| WO | 2018162532 | 9/2018 |

* cited by examiner

*Primary Examiner* — Ryan S Cannon
(74) *Attorney, Agent, or Firm* — JMB Davis Ben-David

(57) ABSTRACT

The invention relates to a frame for photovoltaic modules into which connection sockets and module electronics can be integrated so as to be easily accessible and which is simultaneously used as a guide system for connection cables.

11 Claims, 10 Drawing Sheets

FRAME FOR PHOTOVOLTAIC MODULES

CROSS-REFERENCE TO RELATED APPLICATION

Figure 1:
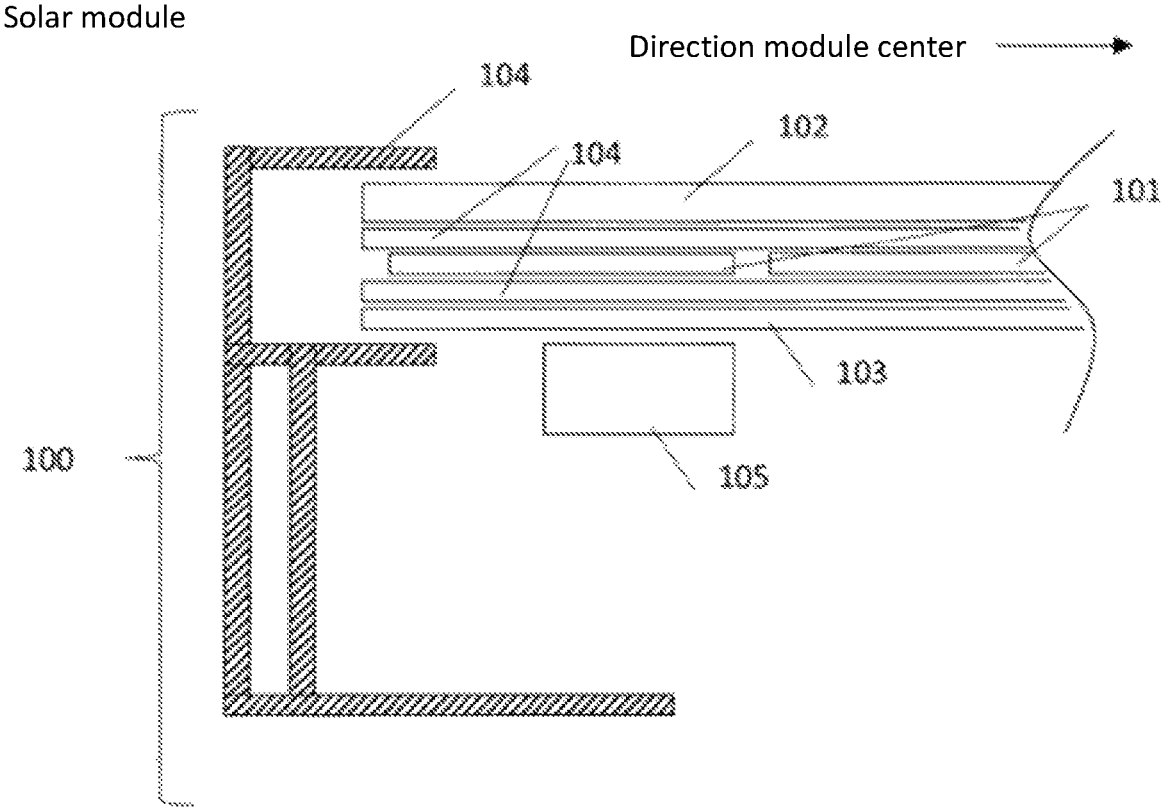

This is the U.S. National Stage of International Patent Application No. PCT/DE2020/000251 filed Oct. 17, 2020, which claims priority to German Patent Application No. 10 2019 008 853.0 filed Dec. 19, 2019.

FIELD OF THE INVENTION

The present invention relates to a frame for photovoltaic modules and to the integration of power electronics in this frame.

Prior art Photovoltaic modules (100) according to the prior art consist of solar cells (101) made of crystalline silicon, which are typically laminated between a glass panel (102) and a backsheet foil (103) or between two glass panels by means of two laminating foils (104). The layer structure back sheet foil/laminating foil/solar cells/laminating foil/glass is called laminate.

Figure 2:
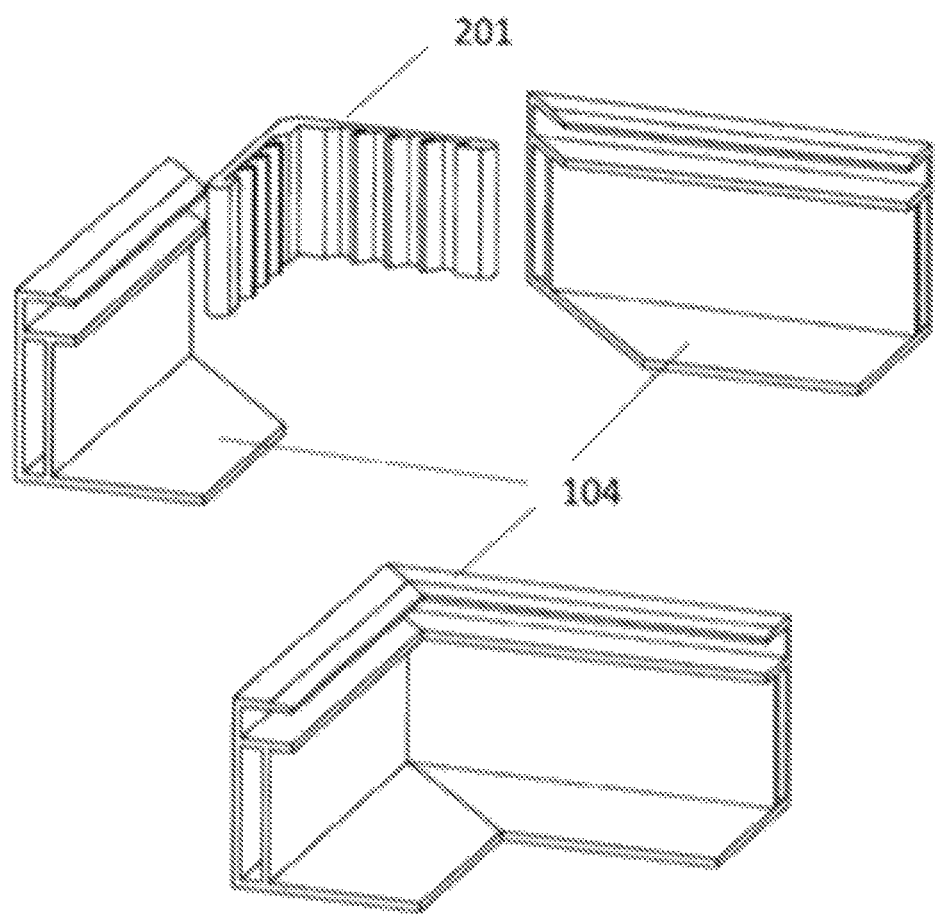

As shown in FIG. 1, the photovoltaic modules are typically framed with aluminum frames (104) to ensure mechanical stability and to attach mounting clamps. FIG. 2 shows the cross-section of such a frame profile (104) as well as the connection of two frame profiles with so-called connector bones (201) at the 4 corners of a photovoltaic module. The frame profiles are pressed onto the edges of the laminate and typically sealed with silicone or sealing tape.

The photovoltaic modules have connection sockets (105) applied to the back of the back sheet or back glass. The term connection socket may include various elements in this patent specification. According to the prior art, a connection socket comprises a housing typically made of plastic. It further comprises contact pads or contact terminals, to which the solder ribbons from the inside of the photovoltaic module are electrically conductively connected by soldering or by means of clamping. Furthermore, the connection socket typically contains three so-called by-pass diodes, which are connected in parallel to a certain number of solar cells inside the photovoltaic module. The connection sockets typically have two connection cables with connector plugs.

In the following, the term connection socket is used in such a way that individual or all of these elements can be included. For example, connection sockets without by-pass diodes are conceivable, or also connection sockets with connector plugs that are attached directly to the housing of the connection socket without cables.

Figure 3:
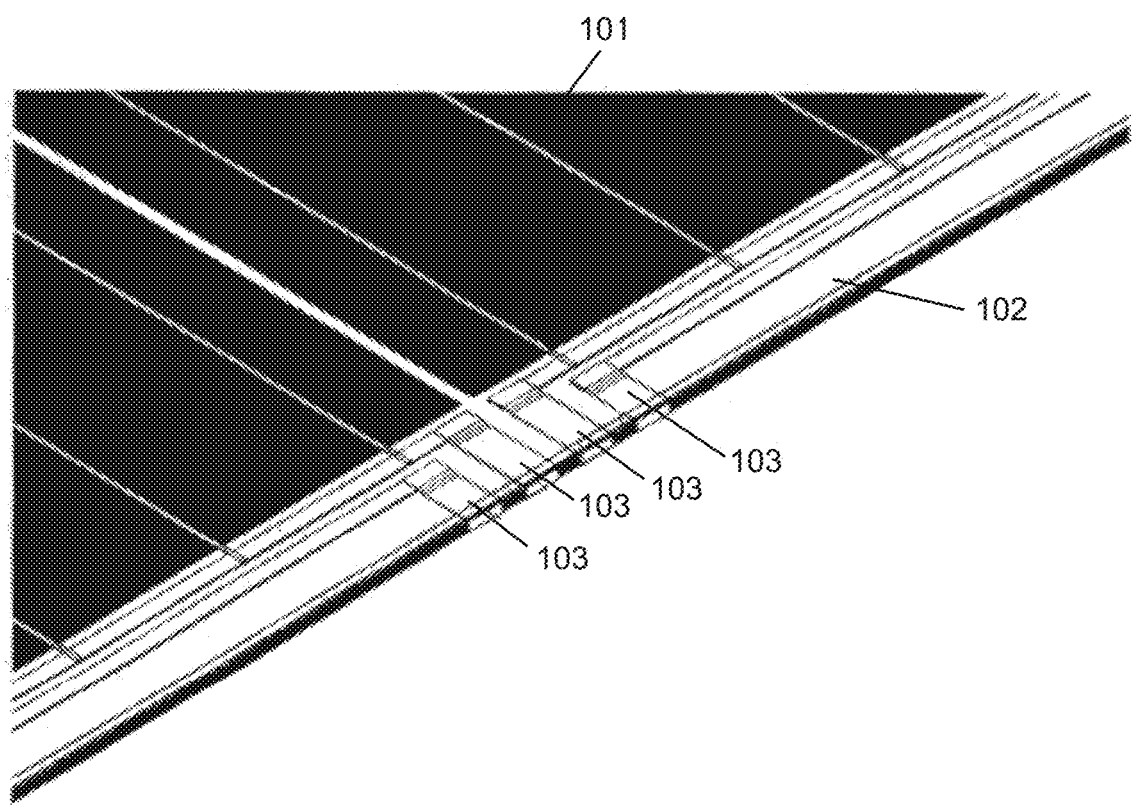

During the production of photovoltaic modules, the solder ribbons with which the solar cells are interconnected have to be laboriously fed out of the laminate through the rear side lamination foil and the back sheet foil. For this, the foils have to be slit and then the solder ribbons have to be pulled out. This process is mostly done manually, as automation would be very expensive. It would be much easier to feed the solder ribbons (301) through at the side of the module edge between the foils as shown in FIG. 3. Particularly in the case of glass/glass modules, the lateral feed-through is much simpler and less expensive than the feed-through to the back of the module, since holes have to be drilled at great expense for the latter. In the case of so-called bifacial modules, which have a transparent module and cell back sheet and thus also enable illumination of the solar cells from the back sheet, the connection socket is particularly disturbing, as it spills individual solar cells from behind and thus leads to the total string current being reduced. Connection sockets typically have two connection cables with plugs, as described above. To interconnect the modules, the plugs of one module are connected to the plugs of the neighboring modules. The cables typically hang in the air and have to be fixed with clamps or cable ties to prevent them from rubbing against the substructure or the roof and damaging the insulation of the cables. In practice, however, it is difficult to completely avoid sagging of the cables, since the cables are difficult to access during assembly, particularly when installed on roofs—and there are only a few fixation points. A cable routing system in which the cables are easily accessible and permanently protected would be desirable.

Another problem is that during installation it is very easy to forget to connect the cables of one module with the cables of the neighboring module. After mounting the modules, it is very difficult to check whether all modules are actually connected to one another.

It would be desirable to have a system that allows easy control of the interconnection after assembly.

In addition to the connection socket, photovoltaic modules can also be equipped with electronic circuits for module electronics that allow better optimization and monitoring of photovoltaic modules. These circuits can be, for example, so-called optimizers or microinverters. For thermal and mechanical reasons, it is advantageous to integrate such electronic circuits in the module frame. A frame-integrated microinverter is known from patent specification WO2018162532A1.

If the electronic circuitry is integrated into a standard frame, the same problems with cable routing arise as with the connection sockets. In addition, replacing defective devices is time-consuming because the inner side of the module frames is difficult to access.

Improved accessibility of the module electronics would be desirable.

DESCRIPTION OF THE INVENTION

It is the object of the invention to develop a module frame in which connection sockets or module electronics can be integrated in an easily accessible manner and which can serve as a cable routing system.

The invention solves the object by a module frame (401) with a profile that is at least partially open to the outside and thus provides an external volume (402) for cable routing and for integrating module electronics.

Figure 4:
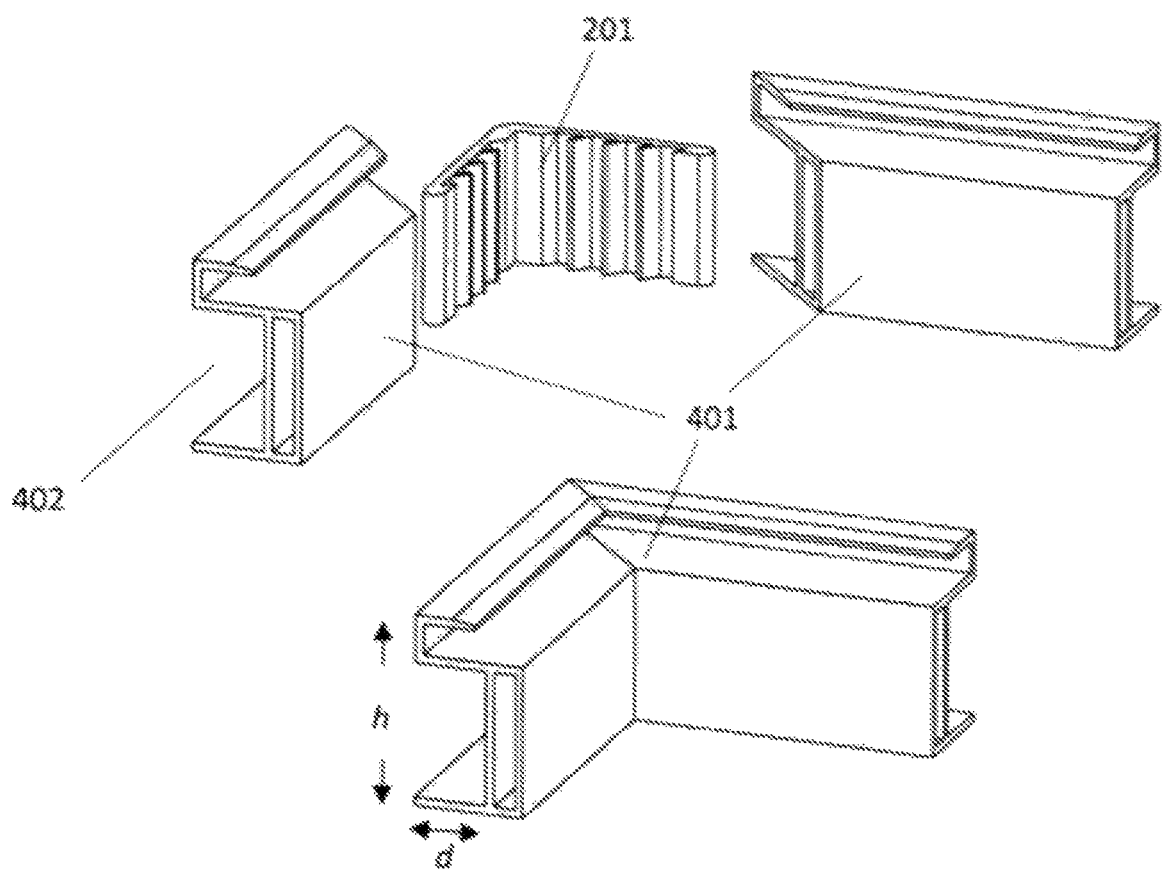

FIG. 4 shows a possible embodiment of the invention. The frame can be made of aluminum, but also of other materials, such as galvanized steel or steel coated with Magnelis. The height of the frame h is typically 25-40 mm.

Exemplary embodiments of the invention are described below with reference to the accompanying figures. The elements shown in the figures are not to scale. They serve to explain essential aspects of the embodiments. Complete electronic circuits and solar modules may include other elements not shown here.

The features of the various embodiments can be combined with each other in any way, unless such a combination is explicitly excluded or excluded for technical reasons.

Figure 5:
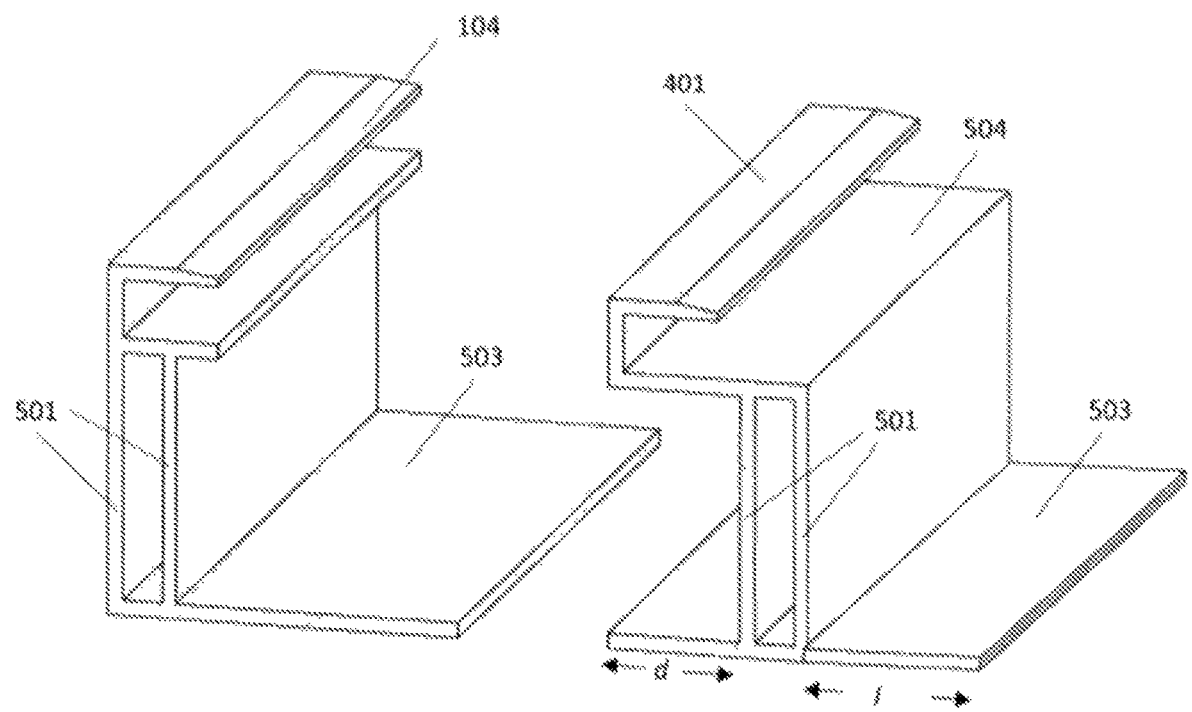

FIG. 5 illustrates the comparison between a standard frame (104) and the new module frame (401). The vertical webs (501) are very similar in the two module frames, but in the new frame (401) they are offset inwards by the distance d. The distance d is between 3 and 50 mm. This provides an easily accessible region at the outside of the module frame. Another advantage is that the distances between the webs (501) on opposite sides of the module are shortened, which significantly reduces the mechanical stress on the module glass and the solar cells, because the dependence of the forces and stresses that occur on this distance is disproportionate.

By repositioning the webs towards the center of the module, the center of gravity of the profiles also offsets towards the center of the module. The center of gravity circumference around the module is thus reduced. This reduces the metal consumption per module, which in turn reduces the cost of the module frame.

In various embodiments of the invention, the bottom side (503) of the module frame can be extended by length l in the direction of the module center to provide the required torsional rigidity.

Figure 6:
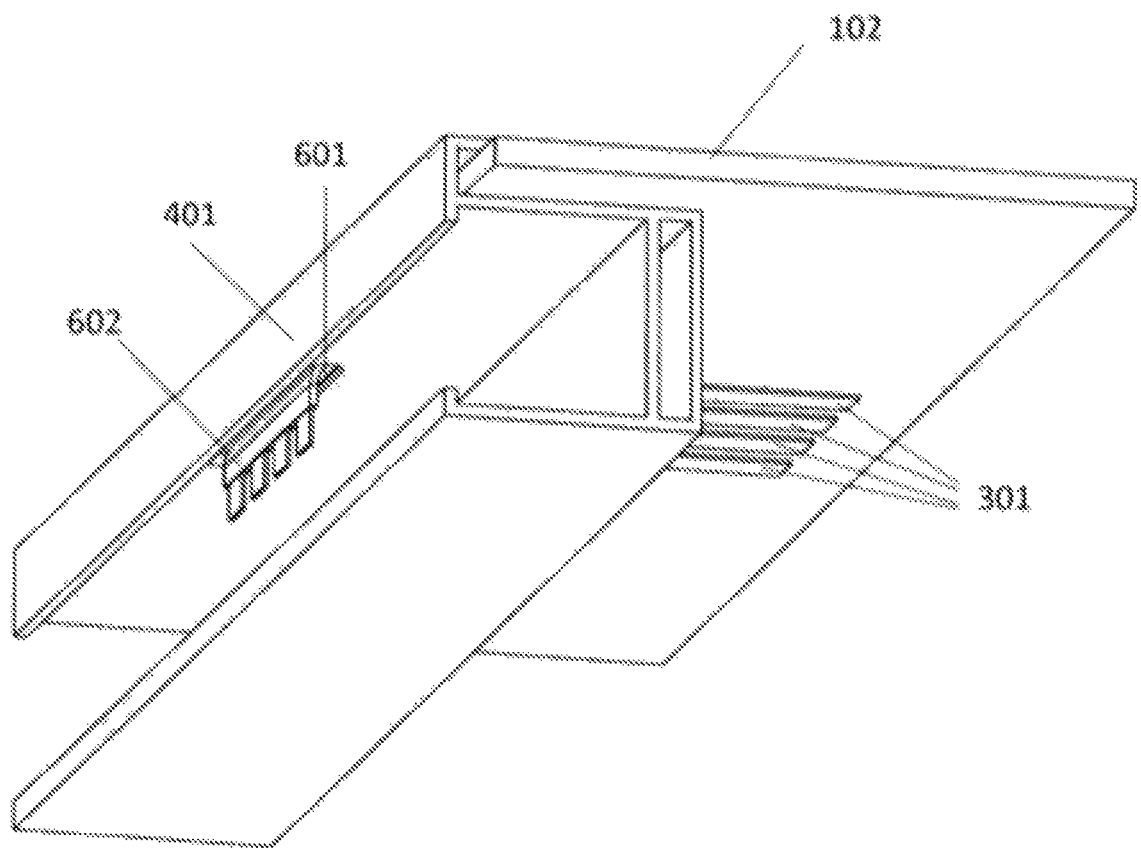
Figure 7:
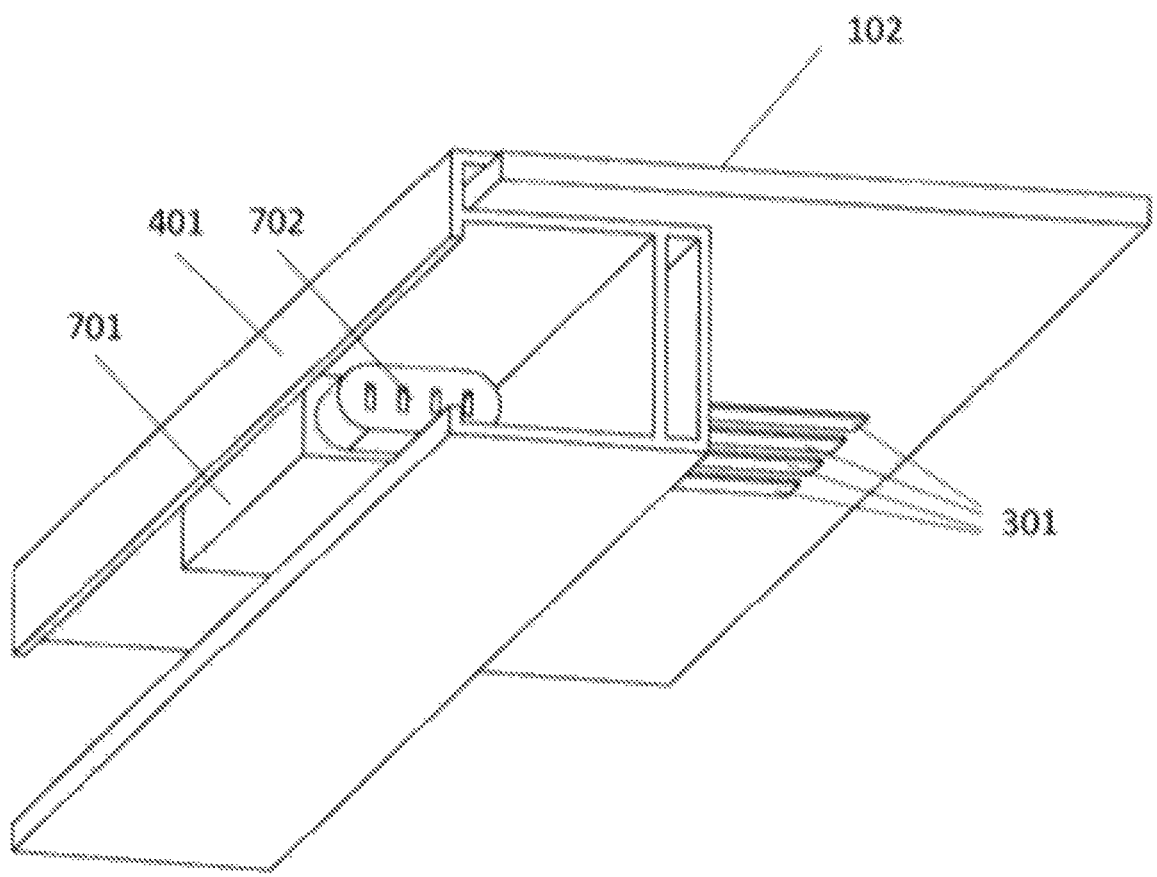

As shown in FIG. 6, the solder ribbons (301) can very easily be led out to the side of the laminate and fed through an opening (601) in the frame (401). They are very easily accessible there and can be soldered to the contacts of a connection socket (105). FIG. 7 shows a possible embodiment (701) of a connection socket for frame integration, which is already prepared with the plug (702) for the connection of an electronic circuit.

The plug may have two or more contacts. Instead of a plug, the connection socket may also be equipped with two or more connection cables in a further embodiment of the invention.

To feed the solder ribbons into the module frame, it is important to electrically insulate the ribbons from each other and from the module frame. For this purpose, the ribbons can be wrapped with an insulating tape (602). In one embodiment of the invention, the photovoltaic module is equipped with a micro-inverter. In this case, the voltage between the solder ribbons and the module frame is not up to 1500 V as in a typical DC series connection of the modules, but the DC voltage is at most the open circuit voltage of the photovoltaic module, i.e., typically less than 100 V.

This means that the voltage is in the low-voltage range and the requirements for the dielectric strength of the insulation are significantly lower.

For the connection socket, integration in the module frame is advantageous because the frame acts as a cooler and thus the thermal load on the by-pass diodes is significantly lower. If, in one embodiment of the invention, the connection socket is formed with a plug and the by-pass diodes are located in an additional removable unit, a further advantage is that the modules can be separated from each other under full load without the risk of electrical flashover and sparking.

Figure 8:
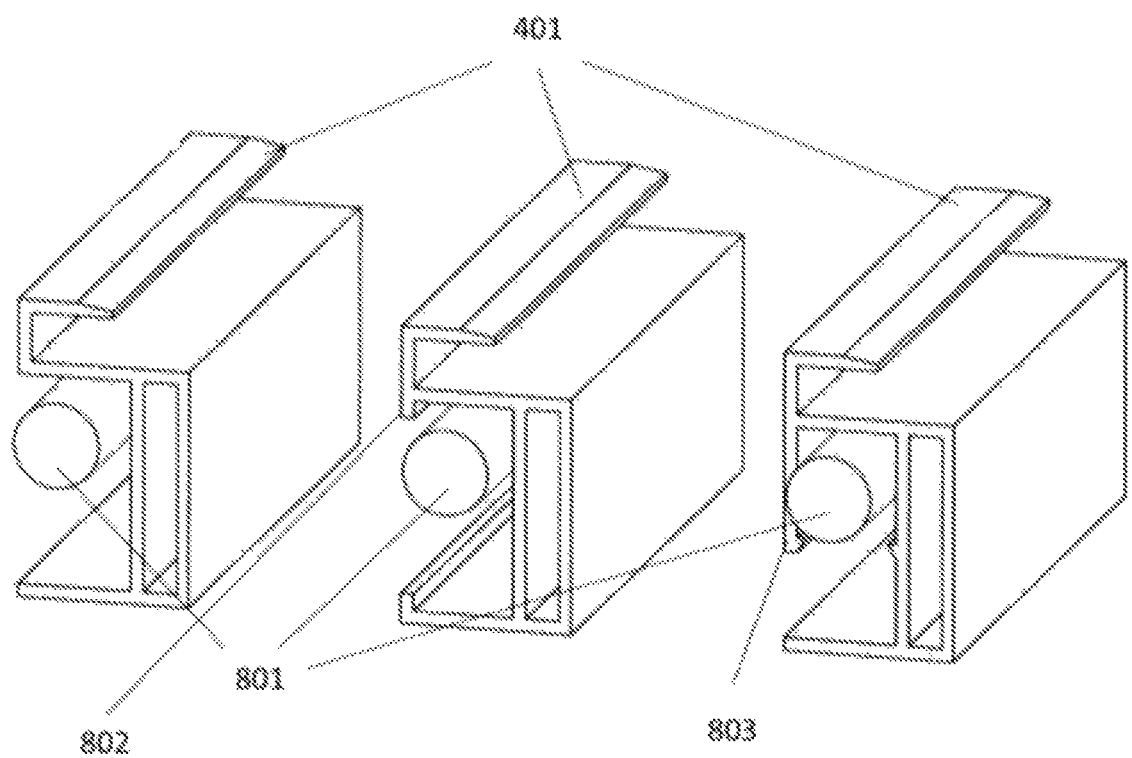

FIG. 8 shows various embodiments of the invention with respect to cable routing for interconnecting multiple modules. The cables (801) are securely guided in the module frame (401) and always remain in the plane of the modules. Even when passing from one module to the next module, they do not have to leave the module plane as in prior art interconnection where the cables have to pass under the module frame. This results in very clean cable routing. The cables can be fixed in various ways, e.g. with cable ties or clips or even more simply by guide lips (802) or guide channels (803). Multiple cables can also be routed in the frame. In addition, the system offers an elegant and convenient way of routing the cables in the frame around module corners if, for example, one module row is to be connected to the next module row. The possibility to realize special interconnections by leaving the module level remains. For the cables, it is irrelevant whether they are DC cables, AC cables or cables of the potential equalization for the substructure.

The cables are easily accessible and permanently protected. Wiring with the present invention can massively simplify module installation workflows. The modules no longer have to be lifted laboriously to be able to reach the cables. Instead, the modules can first be mechanically fixed in place. Then the cables of the individual modules are connected to each other. This also makes it easy to check the cabling. It is hardly possible anymore to forget to connect one module to the next.

The length of the connecting cables between the modules is significantly shorter in the present invention than in the prior art, since no additional length has to be provided for tilting and subsequent positioning of the modules. Typical cable lengths according to the prior art are 2×1000 mm. For the present invention, cable lengths of 2×500 mm are sufficient. This increases the module power by about 0.5 W per module.

Figure 9:
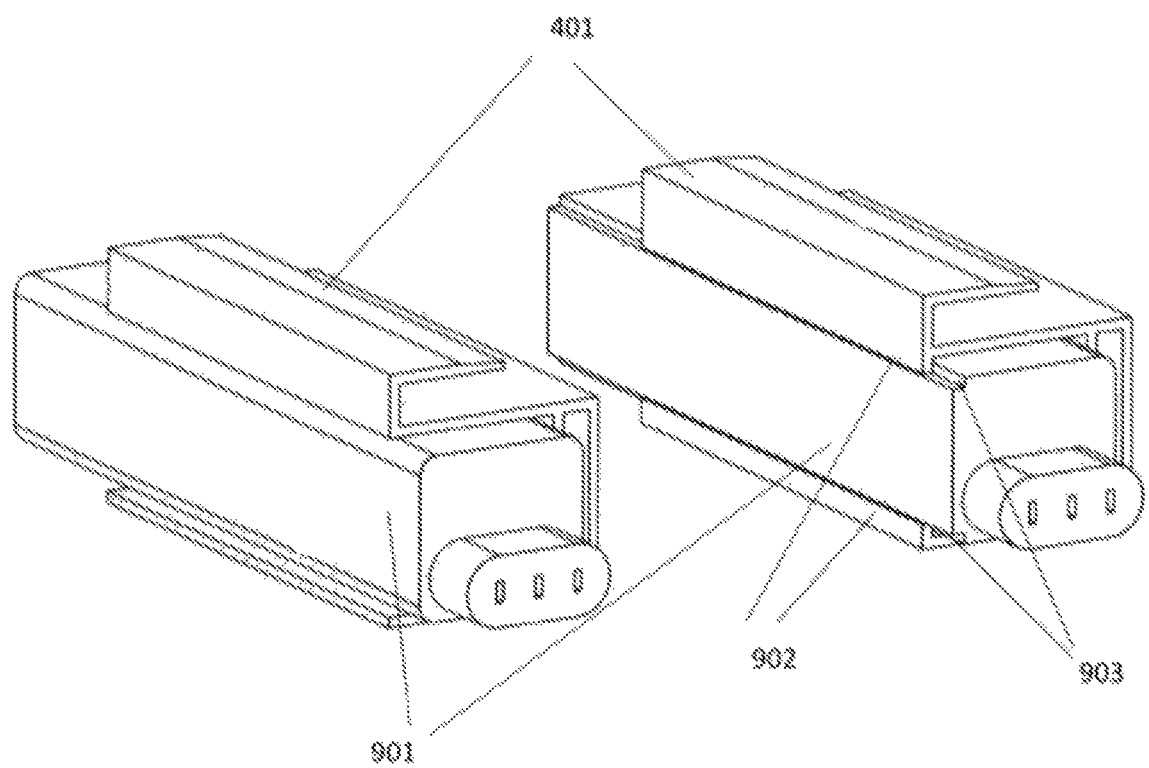

The invention becomes particularly advantageous when module electronics such as optimizers or microinverters are used. These are integrated in the frame, as shown in FIG. 9 for various embodiments of the invention. As described in patent specification WO2018162532A1, the module frame (401) performs a dual function for the module electronics (901). First, the frame provides effective mechanical protection for the module electronics, so that the housing of the module electronics can be realized at a very low cost. On the other hand, the module frame represents a heat sink that cools the module electronics and leads to a significant extension of the service life of the module electronics. Since many aging processes are thermally activated and have an exponential dependence on temperature, cooling by 10° C. already leads to a doubling of the service life.

Figure 10:
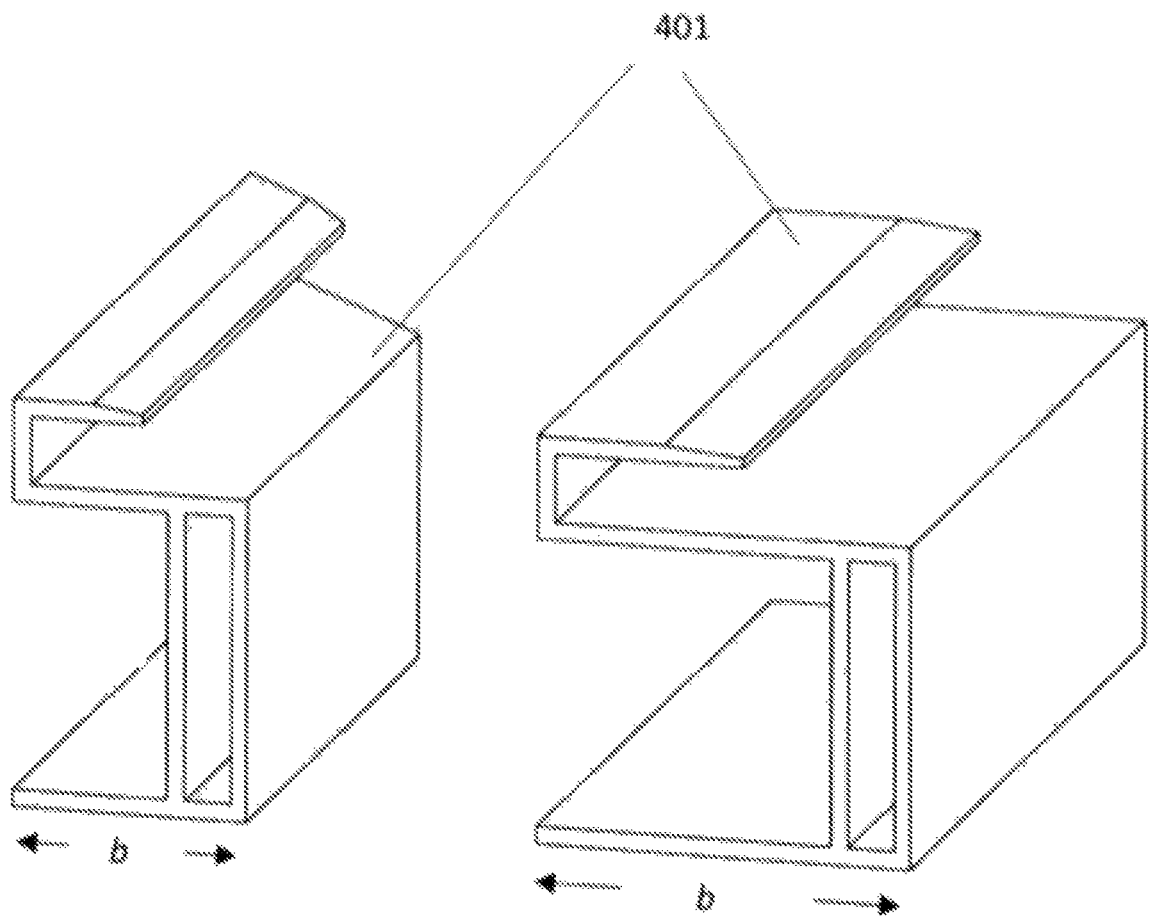

By adjusting the cutting angle of the frame profiles at the 4 module corners, frame profiles with different widths b can be combined as shown in FIG. 10. This means, for example, that the width b on the module side on which the module electronics are accommodated can be greater than on the other three module sides.

To achieve maximum module efficiency, it is desirable to keep the distance between the module edge and the solar cells as small as possible. In the prior art, the solar cells do not rest on the module frame. So that in the present invention there is no increased mechanical loading of the solar cells by the module frame and the solar cells can nevertheless lie above the frame profile, in one embodiment of the invention the support (504) is lowered in the direction of the module center in such a way that an intermediate space is created between the solar cells and the support surface (504). This can be filled with a flexible material such as silicone during frame assembly. The lowering can be done, for example, by chamfering, rounding or a step.

The module electronics can be fixed in the module frame in various ways. Particularly advantageous is the embodiment shown in FIG. 9 on the right, in which the module electronics are fixed by simply snapping one or more grooves (903) located in the housing of the module electronics into webs (902). The module electronics can then be slid onto the contact plug (702) of the connection socket (701) within the frame.

In one embodiment of the invention, the connection socket may be combined with the module electronics. The invention makes it very easy to identify defective module electronics components if they have a status LED that visibly lights up between the modules in the event of a fault. In addition, the invention makes it very easy to replace defective module electronics components. Depending on the configuration of the entire photovoltaic system, the module with the defective component does not even have to be unscrewed. It is sufficient to disconnect the connector plug of the module electronics and replace the electronics.

FIGURES

FIG. 1: Cross-section through a photovoltaic module (100) according to the prior art. The solar cells (101) are typically laminated with EVA foils between the module glass (102) and a back sheet or, a back glass (103). The whole laminate is enclosed by an aluminum frame (104). For the electrical connection of the solar cells, the module is equipped with at least one connection socket (105).

FIG. 2: Profile of a standard module frame (104) and associated connector bones (201) for connecting the profile pieces at the four corners of the module.

FIG. 3: Preferred lateral feed-through of the solder ribbons (301) out of the laminate.

FIG. 4: Embodiment of the invention comprising the module frame (401) with the profile partially open to the outside and an external volume (402) accessible from the outside, and the connector bones (201).

FIG. 5: Comparison of a standard frame (104) with an embodiment of the invention (401). The vertical webs (501) are offset towards the center of the module in the case of the invention: The bottom plate (503) may extend beyond the webs (501) by various lengths l in various embodiments of the invention. The laminate rests on the support (504).

FIG. 6: Embodiment of the invention illustrating a possible feed-through of the solder ribbons (301) through the module frame (401). The solder ribbons are fed through the opening (601) to the outside of the module frame. They may be wrapped with insulating tape (602) for electrical insulation.

FIG. 7: Embodiment of a connection socket (701) integrated in the module frame (401) with a connector plug (702) for a module electronics.

FIG. 8: Various embodiments of the invention with different options (802) and (803) for guiding the connecting cables (801).

FIG. 9: Various embodiments of the invention with frame-integrated module electronics (901), which can be fixed in the module frame (401) with springs (902) and matching grooves (903).

FIG. 10: Various embodiments of the invention with module frame (401) with different width b.

The invention claimed is:

1. A module frame for photovoltaic modules, characterized in that the module frame comprises vertical webs that are offset from an outer edge of the module frame by at least a distance d in the direction of the frame module center, such that a cross-section through the module frame forms an outer volume that is at least partially open having at least one vertical web of the vertical webs limiting said outer volume toward the center of the module frame, wherein the outer volume is designed for cable routing and for integrating connection sockets or module electronics, wherein the module frame has a connection socket integrated into the outer volume of the module frame and a connection plug with two or more contacts, wherein the module frame comprises a module electronics, wherein the module frame has webs for engaging in grooves of module electronics, wherein the module electronics are fixed by snapping one or more grooves located in the housing of the module electronics into said webs, wherein the snapped-in module electronics are slidable onto the connection plug of the connection socket within the frame.

2. The module frame according to claim 1, characterized in that the module frame consists of metal.

3. The module frame according to claim 1, characterized in that the length of the distance d is in the range of 3 mm to 40 mm and that the module frame has a height h in the range of 25 mm to 40 mm.

4. The module frame according to claim 1, characterized in that the module frame has additional guide lips or guide channels for cable routing.

5. The frame module according to claim 1, wherein the cross-section of the outer volume is u-shaped, wherein a basis of the "u" is formed by the vertical webs.

6. The frame module according to claim 1, wherein the vertical webs are arranged in pairs, wherein a first vertical web of each pair is arranged at the distance d toward the center of the frame module, wherein a second vertical web of each pair is arranged in parallel to the first vertical web at a distance greater than d towards the center of the frame module.

7. The frame module according to claim 1, wherein the connection socket is fitted into the outer volume of the module frame, such that the connection socket does not protrude from the module frame.

8. A photovoltaic module with a module frame according to claim 1.

9. The photovoltaic module according to claim 8, characterized in that the connection socket is equipped with a plurality of by-pass diodes.

10. The photovoltaic module according to claim 8, characterized in that connection cables are guided in the outer volume of the module frame.

11. The photovoltaic module according to claim 8, characterized in that it has a microinverter integrated in the module frame.

* * * * *